(12) United States Patent
Yonezawa et al.

(10) Patent No.: US 7,903,386 B2
(45) Date of Patent: Mar. 8, 2011

(54) APPARATUS AND METHOD FOR DRIVE CONTROLLING MICRO MACHINE DEVICE

(75) Inventors: Yu Yonezawa, Yokohama (JP); Takeaki Shimanouchi, Kawasaki (JP); Naoyuki Mishima, Yokohama (JP); Satoshi Ueda, Kawasaki (JP); Xiaoyu Mi, Kawasaki (JP); Masahiko Imai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 407 days.

(21) Appl. No.: 12/071,945

(22) Filed: Feb. 28, 2008

(65) Prior Publication Data

US 2008/0239611 A1    Oct. 2, 2008

(30) Foreign Application Priority Data

Mar. 30, 2007    (JP) .................. 2007-094063

(51) Int. Cl.
*H01G 7/00*    (2006.01)
*H01G 7/04*    (2006.01)
*H01G 5/19*    (2006.01)

(52) U.S. Cl. .................... 361/281; 361/300; 324/548

(58) Field of Classification Search .................. 361/281, 361/300; 345/85; 324/548
See application file for complete search history.

(56) References Cited

U.S. PATENT DOCUMENTS

| | | | |
|---|---|---|---|
| 5,155,573 A | 10/1992 | Abe et al. | |
| 6,391,675 B1 | 5/2002 | Ehmke et al. | |
| 6,509,745 B1 * | 1/2003 | Marszalek | ............ 324/663 |
| 6,670,864 B2 | 12/2003 | Hyvönen et al. | |
| 6,806,988 B2 | 10/2004 | Onuki et al. | |

(Continued)

FOREIGN PATENT DOCUMENTS

CA    2 406 186 A1    10/2001

(Continued)

OTHER PUBLICATIONS

Sallese, "Switch and RF ferroelectric MEMS: a new concept", 2003, Elsevier, Sensors and Actuators, 109 (2004), 186-194.*

(Continued)

*Primary Examiner* — Stephen W Jackson
*Assistant Examiner* — Zeev Kitov
(74) *Attorney, Agent, or Firm* — Westerman, Hattori, Daniels & Adrian, LLP

(57) ABSTRACT

In a method for drive controlling a micro machine device including two electrodes opposing each other and a dielectric layer sandwiched therebetween, a control voltage in a rectangular waveform in which positive and negative polarities are alternately inverted is applied between the two electrodes. A current passing through the micro machine device due to the application of the control voltage are detected with respect to positive and negative sides, and parameters related to a capacitance of the micro machine device are acquired with respect to the positive and negative sides on the basis of the detected current. The control voltage is controlled so that the parameters acquired with respect to the positive and negative sides accord with each other. Thus, variation of the capacitance between the positive side and the negative side can be suppressed in switching drive of a variable capacitance device.

10 Claims, 20 Drawing Sheets

U.S. PATENT DOCUMENTS

| | | |
|---|---|---|
| 7,027,282 B2 | 4/2006 | Ryhänen et al. |
| 7,142,072 B2 | 11/2006 | Katta |
| 7,227,431 B2 | 6/2007 | Katta |
| 7,283,018 B2 | 10/2007 | Katta |
| 2001/0054937 A1 | 12/2001 | Hyvonen et al. |
| 2002/0047491 A1 | 4/2002 | Hirose et al. |
| 2002/0066659 A1 | 6/2002 | Ryhanen et al. |
| 2004/0040828 A1 | 3/2004 | Ivanciw et al. |
| 2005/0104680 A1 | 5/2005 | Katta |
| 2005/0132806 A1 | 6/2005 | Lee et al. |
| 2006/0125746 A1 | 6/2006 | Sallese et al. |
| 2006/0127085 A1 | 6/2006 | Matsuki et al. |
| 2007/0018744 A1 | 1/2007 | Katta |
| 2007/0018750 A1 | 1/2007 | Katta |
| 2008/0180872 A1 | 7/2008 | Mishima et al. |

FOREIGN PATENT DOCUMENTS

| | | |
|---|---|---|
| EP | 0909024 A2 | 4/1999 |
| EP | 1 146 532 A2 | 10/2001 |
| EP | 1 168 608 A2 | 1/2002 |
| JP | 3-284817 A | 12/1991 |
| JP | 8-107245 A | 4/1996 |
| JP | 2002-36197 A | 2/2002 |
| JP | 2002-84148 A | 3/2002 |
| JP | 2004-140597 A | 5/2004 |
| JP | 2005-184270 A | 7/2005 |
| KR | 1020050063238 A | 6/2005 |
| WO | 00/31819 A1 | 6/2000 |
| WO | WO 01/80266 A1 | 10/2001 |

OTHER PUBLICATIONS

Korean Office Action dated Oct. 29, 2009 issued in corresponding Korean Patent Application No. 10-2008-18587.
Gabriel M. Rebeiz, RF MEMS Theory, Design and Technology, Wiley Interscience, , p. 383-428, 2003.
U.S. Appl. No. 12/010,243.
Korean Office Action dated Sep. 26, 2008, issued in corresponding Korean Patent Application No. 10-2007-0009221.
Yao, Jason J.; " Topical Review RF MEMS from a device perspective"; Journal of Micromechanics & Microengineering, vol. 10, Dec. 1, 2000, pp. R9-R38, Institute of Physics Publishing, Bristol, GB.
Reid, J. R. et al.; "Measurements of charging in capacitive microelectromechanical switches"; Electronics Letters, IEE, vol. 38, No. 24, Nov. 21, 2002, pp. 1544-1545, Stevenage, GB.
European Search Report dated Feb. 9, 2009, issued in corresponding European Patent Application No. 08100445.9.
Chinese Office Action dated Mar. 10, 2010, issued in corresponding Chinese Patent Application No. 2008-10086194.
Japanese Office Action dated Mar. 30, 2010, issued in corresponding Japanese Patent Application No. 2007-094063.
U.S. Office Action dated Aug. 12, 2010, issued in corresponding U.S. Appl. No. 12/010,243.
Office Action dated Nov. 8, 2010 issued in corresponding U.S. Appl. No. 12/010,243.
Office Action dated Jan. 12, 2011 issued in corresponding U.S. Appl. No. 12/010,243.

* cited by examiner

APPARATUS AND METHOD FOR DRIVE CONTROLLING MICRO MACHINE DEVICE

BACKGROUND OF THE INVENTION

1. Field of the Invention

The present invention relates to an apparatus and a method for drive controlling a micro machine device including two electrodes opposing each other and a dielectric layer sandwiched therebetween.

2. Description of the Related Art

Recently, application of a micro machine device with a fine structure obtained through micro machine processing technology [also designated as MEMS (Micro Electro Mechanical Systems) or MST (Micro System Technology)] to a radio communication circuit is regarded significant (see Japanese Patent Publication Nos. 2002-84148 and 2002-36197).

Since a micro machine device including a dielectric layer sandwiched between two electrodes functions as a variable capacitor by controlling a driving voltage, a capacitance with a desired value can be obtained in accordance with a control voltage. It is noted that a micro machine device is sometimes designated as a "micro machining device", a "micro machine element" or an "MEMS electromechanical component".

On the other hand, in accordance with recent development of mobile communication systems, cellular phones (mobile telephone terminals) and mobile information terminals are now rapidly spreading. For example, in cellular phones, high frequencies of quasi-microwave bands of a 800 MHz through 1.0 GHz band and a 1.5 GHz through 2.0 GHz band are used. In order to cope with such multiple bands employed in cellular phones, it is necessary to provide an amplifier circuit and the like dedicated to a high frequency of each band. This is because it is difficult to construct transmission lines and matching circuits with small loss over a wide band. For overcoming this problem, use of a variable capacitor for enlarging the bandwidth of a matching circuit has been proposed. In particular, a variable capacitor fabricated through the aforementioned micro machine processing technology (hereinafter referred to as a "variable capacitance device") has a large Q value and can exhibit good characteristics with small loss and small signal distortion (see RF MEMS THEORY, DESIGN AND TECHNOLOGY, WILEY INTERSCIENCE, GABRIEL M. REBEIZ, P 383).

There arises, however, a problem that due to charge-up of a dielectric caused in applying a DC voltage to a variable capacitance device, the initial capacitance cannot be restored even when the DC voltage is eliminated. Therefore, change of the capacitance CP against a control voltage VC exhibits hysteresis, and hence, the reproducibility is poor and a desired capacitance CP cannot be accurately obtained.

Specifically, FIG. 2 shows curves L1 and L2 corresponding to change of the capacitance CP caused by gradually changing the control voltage VC. The control voltage VC is gradually increased from 0 V to 12 V, reduced to 0 V thereafter, further reduced to −12 V, and then increased to 0 V. During this change, the capacitance CP is changed as shown with arrows beside the curves L1 and L2, and the hysteresis is caused. Accordingly, even when the control voltage VC has the same value, the capacitance CP has different values in increasing the control voltage and in reducing the control voltage.

In order to avoid such charge-up, the present applicants have proposed switching drive for inverting (switching) the positive/negative polarities of the control voltage VC in a given short period of time. Specifically, when the switching drive is employed, a positive voltage and a negative voltage are alternately applied to the two electrodes of a variable capacitance device, so as not to cause polarization derived from transfer of space charge within the dielectric layer, and thus, the occurrence of the charge-up is suppressed.

When the switching drive is employed, however, the following problem occurs: In some variable capacitance devices, voltage-capacity characteristics are varied between a positive side and a negative side. Therefore, the value of the capacitance CP may be different between the positive side and the negative side in the switching drive, and hence, a constant capacitance cannot be sometimes attained. Also, since a transmission signal is generally applied to the variable capacitance device even during the switching drive, it is apprehended that the charge-up also may be caused by the transmission signal.

In a variable capacitance device whose characteristics are different between the positive side and the negative side due to the initial variation or the charge-up caused during the use, the value of the capacitance CP is varied in the switching drive. Therefore, when such a variable capacitance device is used in, for example, a matching circuit, it cannot keep necessary characteristics.

SUMMARY

The present invention was devised in consideration of the aforementioned problem, and an object of the invention is suppressing variation of a capacitance of a variable capacitance device between a positive side and a negative side in the switching drive.

According to an aspect of the invention, in a method for drive controlling a micro machine device including two electrodes opposing each other and a dielectric layer sandwiched therebetween, a control voltage in a rectangular waveform in which positive and negative polarities are alternately inverted is applied between the two electrodes, a current passing through the micro machine device due to the application of the control voltage is detected with respect to positive and negative sides, parameters related to a capacitance of the micro machine device are acquired with respect to the positive and negative sides on the basis of the detected current, and the control voltage is controlled in such a manner that the parameters acquired with respect to the positive and negative sides accord with each other.

Since the control voltage in the rectangular waveform in which the positive/negative polarities are alternately inverted is applied between the two electrodes, the occurrence of charge-up is suppressed. Since the control voltage is controlled so as to make the parameters related to the capacitance with respect to the positive and negative sides accord with each other, the variation of the capacitance between the positive side and the negative side can be suppressed.

In another aspect of the invention, the magnitude of the control voltage is controlled in such a manner that time elapsed until a peak value of a current at a rise of the rectangular waveform is reduced to a given ratio accords with a given set value.

In this case, when the given ratio is 36.8%, a time constant obtained in charging the capacitance formed between the two electrodes with the control voltage can be used as the given set value.

DESCRIPTION OF THE PREFERRED EMBODIMENTS

Figure 1:
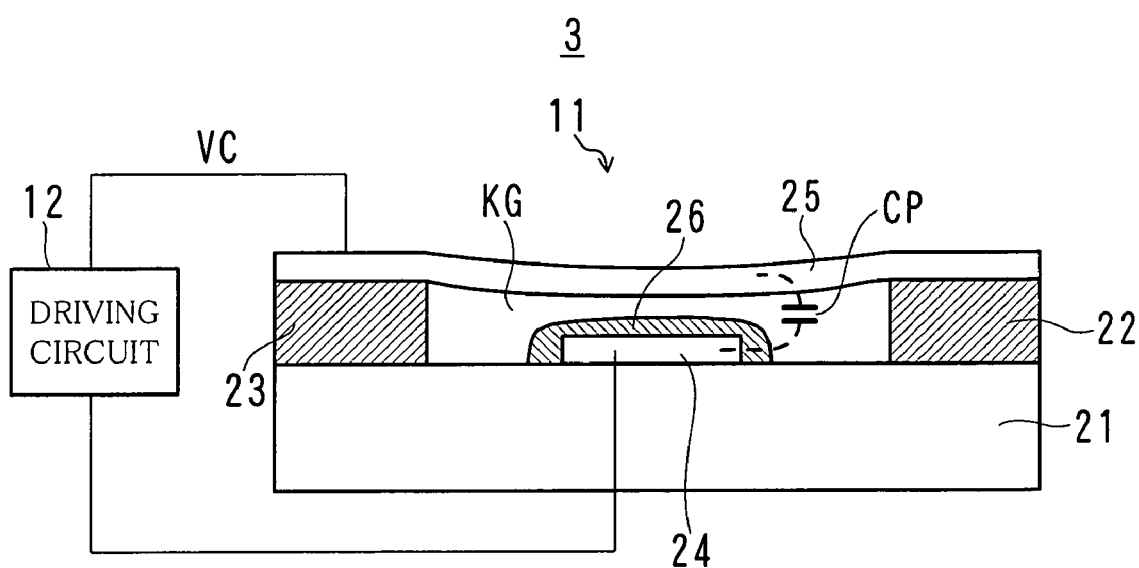
FIG. 1 is a diagram for showing an exemplified micro machine system according to an embodiment of the invention.

In FIG. 1, a micro machine system 3 includes a variable capacitance device 11 corresponding to a micro machine device and a driving circuit 12.

The variable capacitance device (variable capacitor) 11 includes a lower electrode 24 and a dielectric film 26 covering the lower electrode 24 formed on a substrate 21 of silicon, glass or the like. Furthermore, supporting films 22 and 23 and an upper electrode 25 supported by the supporting films 22 and 23 are formed on and above the substrate 21, respectively. A gap KG is formed between the dielectric film 26 and the upper electrode 25. A capacitance CP is formed between the lower electrode 24 and the upper electrode 25, and the magnitude of the capacitance CP is variable through displacement of the upper electrode 25.

Specifically, a control voltage VC is applied between the lower electrode 24 and the upper electrode 25 by the driving circuit 12. In accordance with the absolute value of the control voltage VC, electrostatic force (electrostatic attraction) works between the lower electrode 24 and the upper electrode 25, and as a result, the upper electrode 25 is attracted to be displaced downward. Thus, the gap KG is narrowed, and hence, the value of the capacitance CP is increased.

The positive/negative polarities of the control voltage VC are preferably switched in a cycle shorter than 5 Hz, namely, in a time period not longer than 200 ms, although the switching timing depends upon the structure, the dimension and the materials of the valuable capacitance device 11. More preferably, the polarities are switched in a cycle not less than 10 Hz (namely, in a time period not longer than 100 ms). Alternatively, the polarity switching cycle may be, for example, approximately 50 through 200 Hz.

Figure 3A:
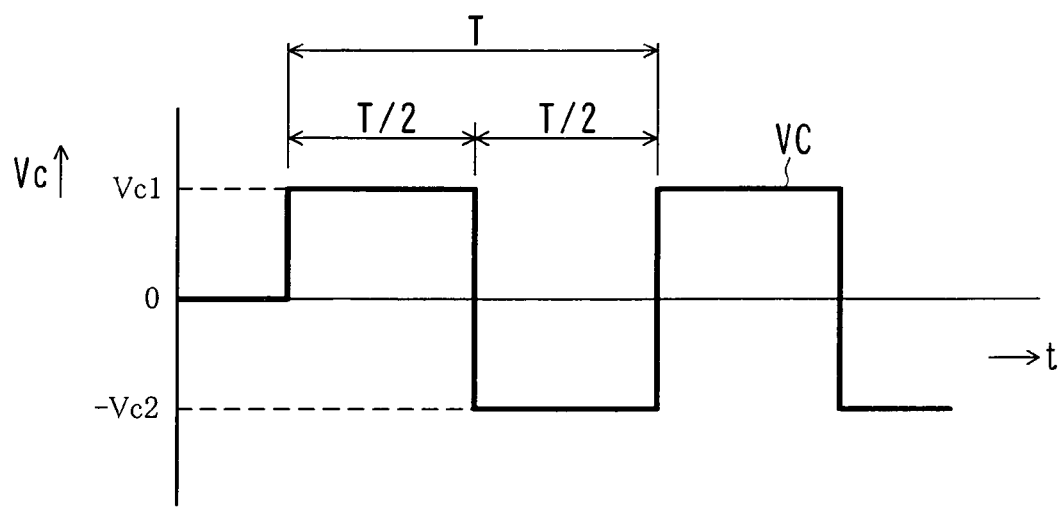
FIGS. 3(a) and 3(b) are diagrams for showing exemplified voltage waveforms of the control voltage employed in switching drive.
Figure 3B:
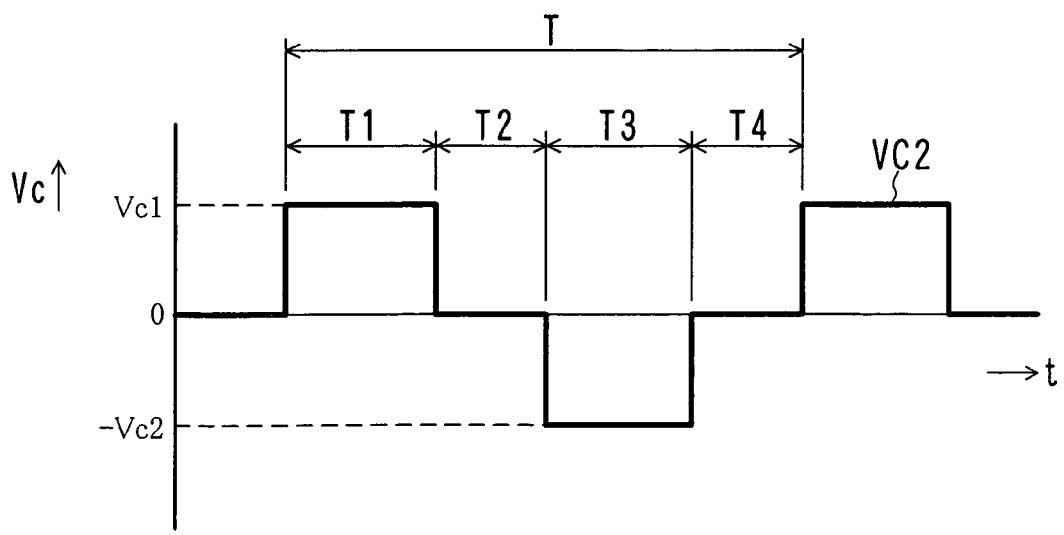

In either case, the control voltage VC has a rectangular waveform in which the positive/negative polarities are substantially periodically inverted as shown in FIG. 3(A). The value of a voltage Vc corresponding to the amplitude of the control voltage VC can be set to an arbitrary value ranging from 0 to the maximum value. It is possible to adopt a control voltage VC2 having a waveform as shown in FIG. 3(B), in which the voltage is 0 in periods T2 and T4.

Since the positive/negative polarities of the control voltage VC are substantially periodically inverted, polarization derived from movement of space charge within the dielectric film 26 is not caused or is merely slightly caused if any. Therefore, no hysteresis is caused or hysteresis is largely reduced in the control of the capacitance CP by the control voltage VC.

Figure 2:
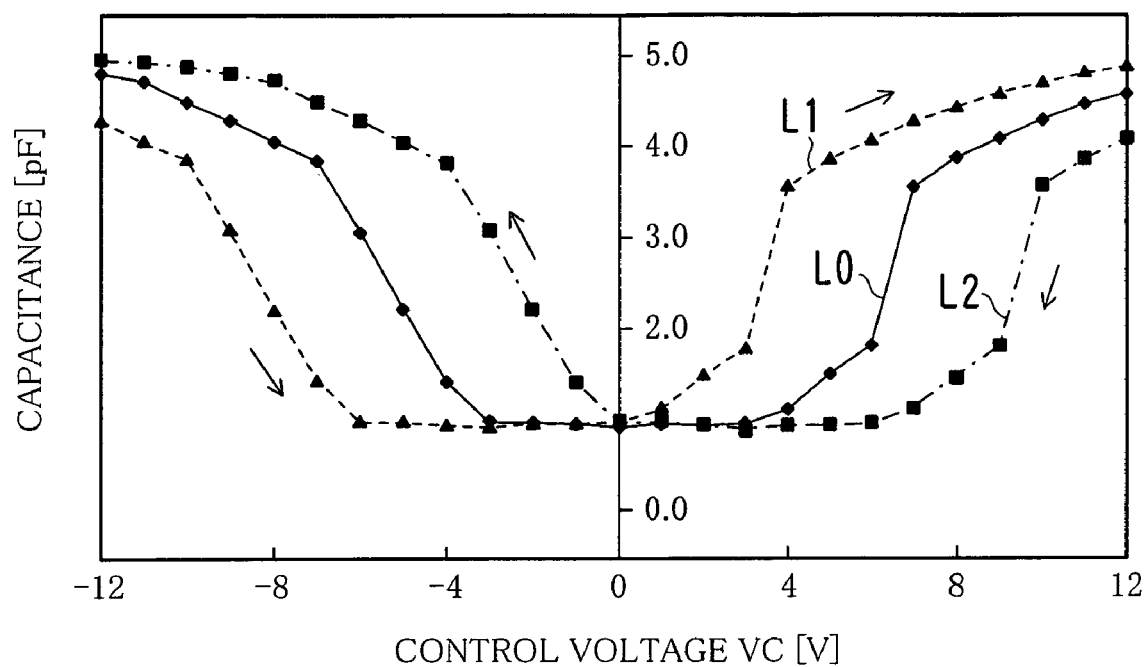
FIG. 2 is a diagram for showing the relationship between a control voltage and a capacitance of a variable capacitance device.

In other words, when the polarity of the amplitude of the control voltage VC is inverted in a short period, the hysteresis of the capacitance CP is minimally caused as shown with a curve L0 in FIG. 2.

Next, the operational principle of the drive method of this embodiment will be described.

Figure 4:
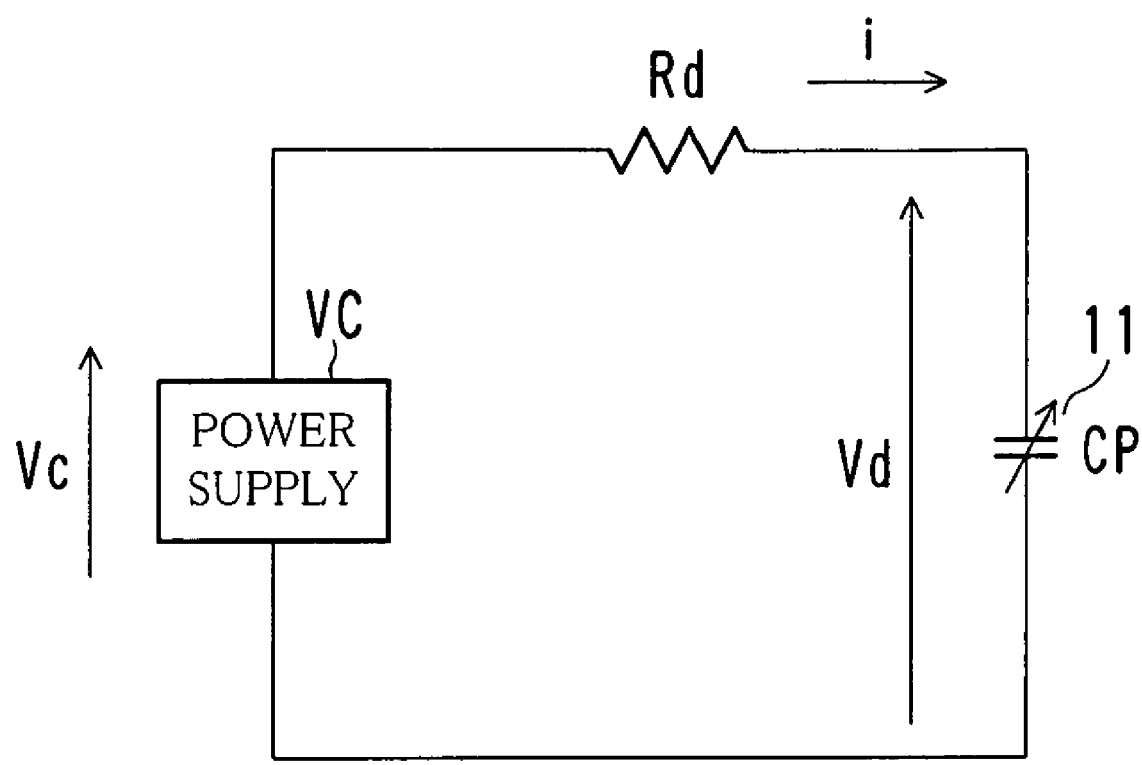
FIG. 4 is a diagram of an exemplified driving circuit.
Figure 5:
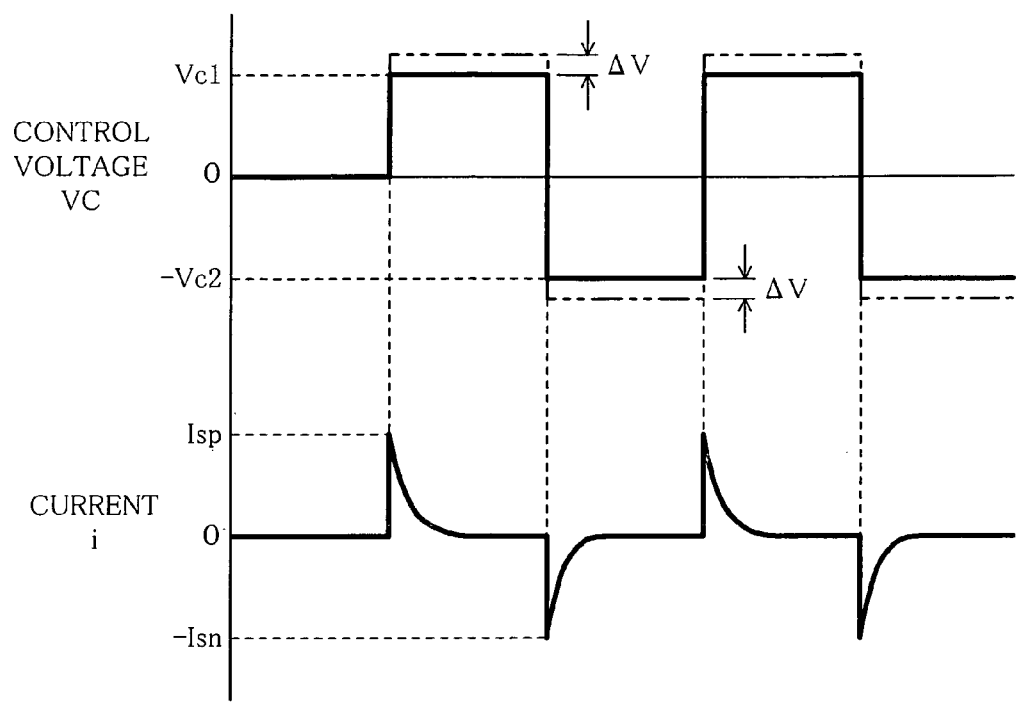
FIG. 5 is a diagram for showing the relationship in waveform between a variable control voltage and a current of a variable capacitance device.

As shown in FIG. 4, the control voltage VC is applied through a resistance Rd to the variable capacitance device 11 by the driving circuit 12. The control voltage VC has a rectangular waveform as shown in FIGS. 5 and 3(A). In this case, a current i has a charge current waveform having a peak value Is at each rise of the control voltage VC as shown in FIG. 5. The value of the current i attained time t after each rise of the control voltage VC is represented by the following formula:

$$i = Is \cdot e(-t/\tau)$$

wherein τ is a time constant obtained as a product of the resistance Rd and the capacitance CP of the valuable capacitance device 11.

It is assumed that the amplitude of the control voltage VC is Vc both on the positive side and the negative side and that the characteristics of the variable capacitance device 11 are constant regardless of the polarity of the voltage. In this case, the peak value of the current i is Is both on the positive side and the negative side. Herein, however, the control voltage VC is generally controlled so as to have different amplitudes on the positive and negative sides, and hence, the peak value of the current i is assumed to be Isp on the positive side and Isn on the negative side.

Also, the theoretical value of the peak value Is can be obtained through calculation based on the amplitude of the control voltage VC and the value of the resistance Rd. Accordingly, when it is herein mentioned that "a peak value Is is detected", the peak value Is may be obtained through the calculation.

Assuming that the value of the resistance Rd is constant, the time constant τ depends upon the magnitude of the capacitance CP, and the locus of a curve corresponding to the change of the current i also depends upon the magnitude of the capacitance CP.

Figure 6:
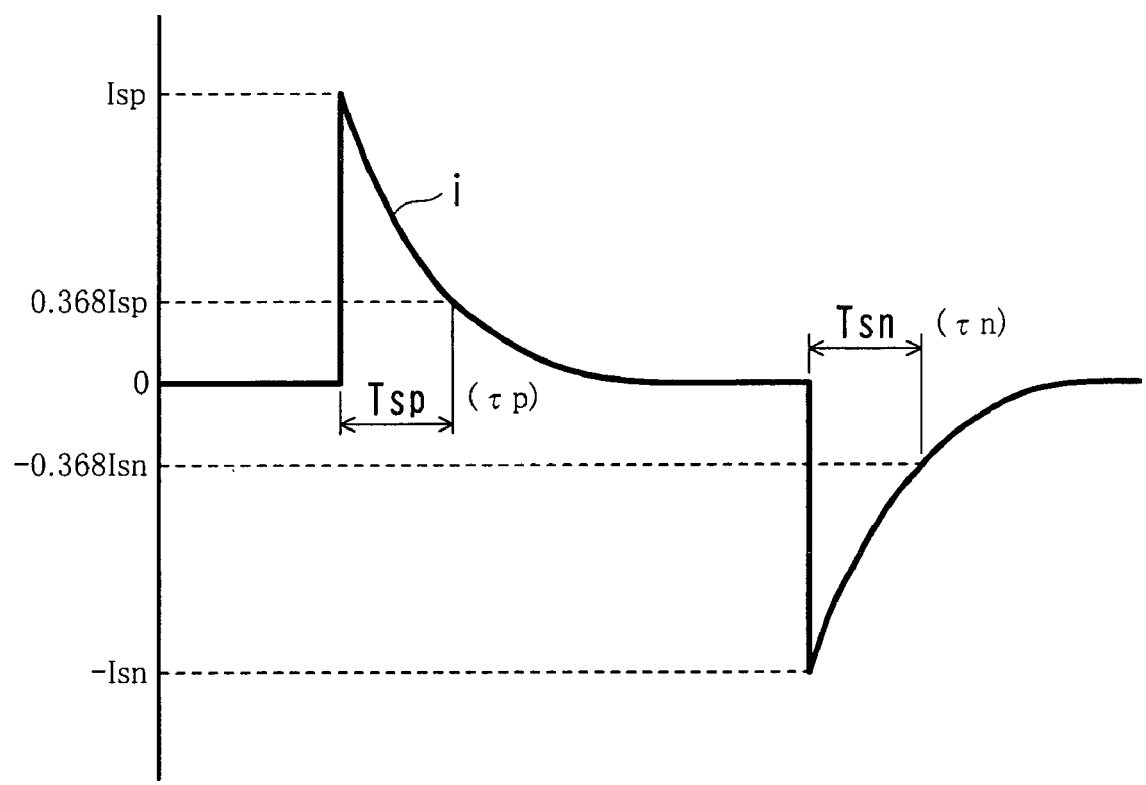
FIG. 6 is a diagram for explaining the relationship between a current and a time constant.

When time Tsp equal to a time constant τp of the positive side has elapsed after the occurrence of the peak of the positive side of the current i as shown in FIG. 6, the magnitude of the current i obtained at this point is lowered to 36.8% of a peak current Isp. Also with respect to the negative side, when time Tsn equal to a time constant In of the negative side has elapsed after the peak of the current i, the magnitude of the current i obtained at this point is lowered to 36.8% of a peak current Isn.

Figure 7:
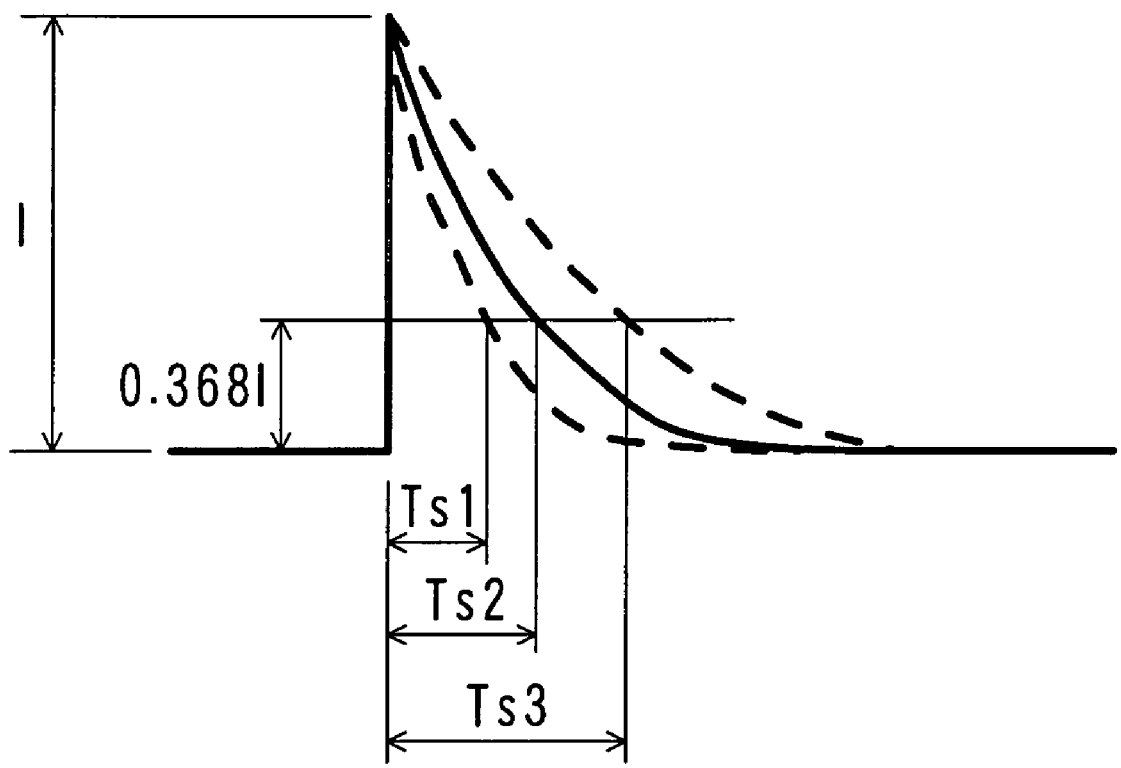
FIG. 7 is a diagram for showing change in the waveform of a current in accordance with a value of a capacitance.

As shown in FIG. 7, the locus of the curve corresponding to the change of the current i caused in charge is varied in accordance with the value of the capacitance CP, and in accordance with this change of the locus, time necessary for the current i to reduce to 36.8% is changed to Ts1, Ts2 or Ts3.

Thus, the time constant τ is detected by measuring the time necessary for the current i to reduce to 36.8%, and the value of the capacitance CP can be calculated based on the time constant τ. Accordingly, when the time constants τp and τn of the positive side and the negative side are detected and a voltage Vcp of the positive side and/or a voltage Vcn of the negative side of the control voltage VC is controlled so that the time constants τp and τn can accord with a previously set reference value, the capacitance CP of the variable capacitance device 11 can accord or substantially accord with a target value and be constant without varying between the positive side and the negative side.

Also, when the control voltage VC is controlled so that the detected time constants τp and τn can be equal to each other, the capacitance CP of the variable capacitance device 11 can be constant without varying between the positive side and the negative side.

Alternatively, in order to detect the time constant τ, instead of measuring the time necessary for the current i to reduce to 36.8%, time Ts necessary for the current i to reduce to an arbitrary ratio other than 36.8% may be measured, so as to obtain the time constant τ through the calculation based on the measured time Ts.

Furthermore, in the case where the control voltage VC is controlled so that the time constants τ of the positive and negative sides can be equal to each other, there is no need to obtain the time constants τ themselves. Therefore, times Ts necessary for the current i to reduce to an arbitrary ratio are measured with respect to the positive side and the negative side, and the control voltage VC is controlled so as to make these times equal to each other.

Specifically, in the case where, for example, time Tsp of the positive side is shorter than time Tsn of the negative side, the voltage Vc1 of the positive side is increased by a small voltage ΔV. Since the voltage Vc1 is thus increased, the upper electrode 25 of the variable capacitance device 11 is attracted toward the lower electrode 24 so as to narrow the gap KG, and thus, the value of the capacitance CP is increased. In this manner, the control voltage VC is automatically controlled so that the time Tsp of the positive side can be increased to be equal to the time Tsn of the negative side.

Alternatively, in the case where the time Tsp of the positive side is longer than the time Tsn of the negative side, the voltage Vc1 of the positive side is reduced by the small voltage ΔV. Since the voltage Vc1 is thus reduced, the gap KG is increased so as to reduce the value of the capacitance CP. In this manner, the control voltage VC is automatically controlled so that the time Tsp of the positive side can be reduced to be equal to the time Tsn of the negative side.

Alternatively, instead of increasing/reducing the voltage Vc1 of the positive side by the small voltage ΔV, the voltage Vc2 of the negative side may be reduced/increased by the small voltage ΔV. The automatic control itself can be performed by employing any of various known methods.

Figure 8:
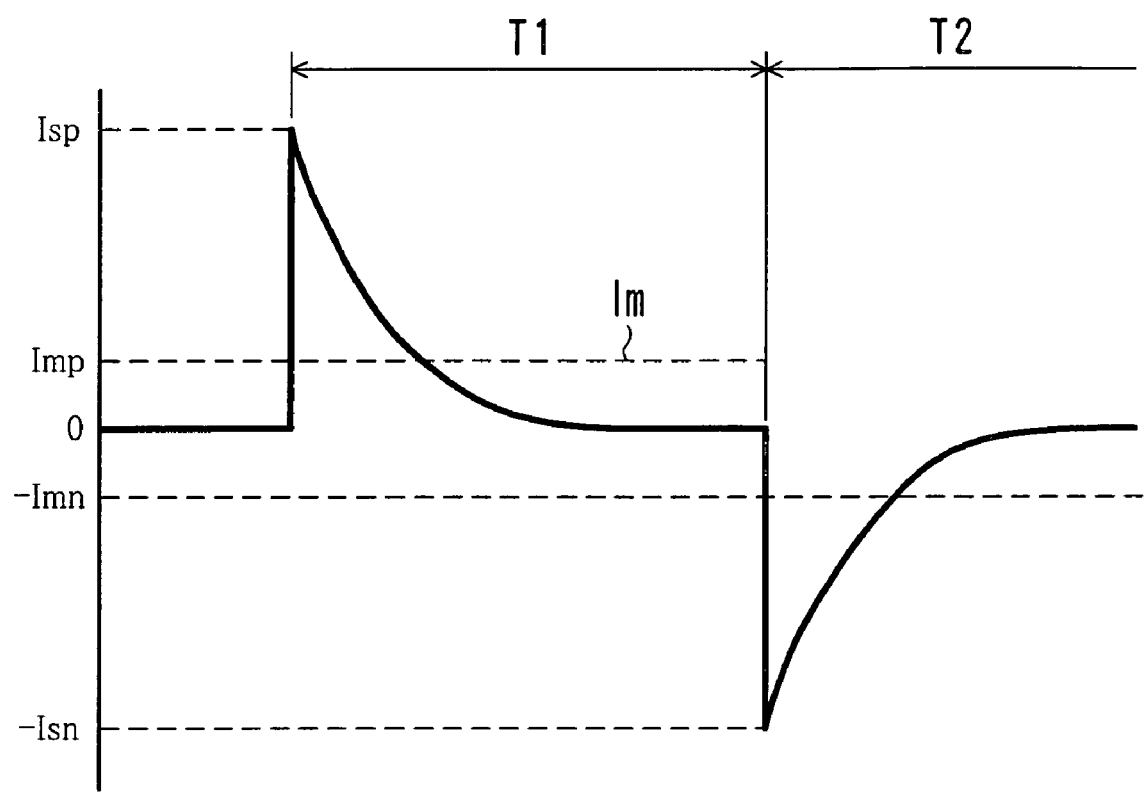
FIG. 8 is a diagram for explaining the relationship between a current and a mean value.

Alternatively, in order to obtain the time constant τ, instead of measuring the time Ts, the peak value Is of the current i and a mean value Im of each cycle T1 or T2 are detected as shown in FIG. 8, so as to obtain the time constant τ through calculation. In this case, data of (time) lengths of the cycles T1 and T2 may be obtained.

Alternatively, the time constant τ can be obtained by detecting the peak value of the current i and the mean value Im of each period and referring to a previously created conversion table. Such a conversion table is created, with respect to various peak values Is1, Is2, Is3, etc. of the current i, as a table for showing the relationship between the mean value Im of the current i and the time constant τ, for example, as shown in FIG. 9, and the table may be stored in an appropriate memory area.

The conversion table may be data or a database corresponding to the correlation among the peak value Is of the current i, the mean value Im and the time constant τ. Alternatively, the conversion table may be a computer program used for obtaining the time constant τ on the basis of the peak value Is and the mean value Im. Further alternatively, these means may be appropriately combined.

Figure 9:
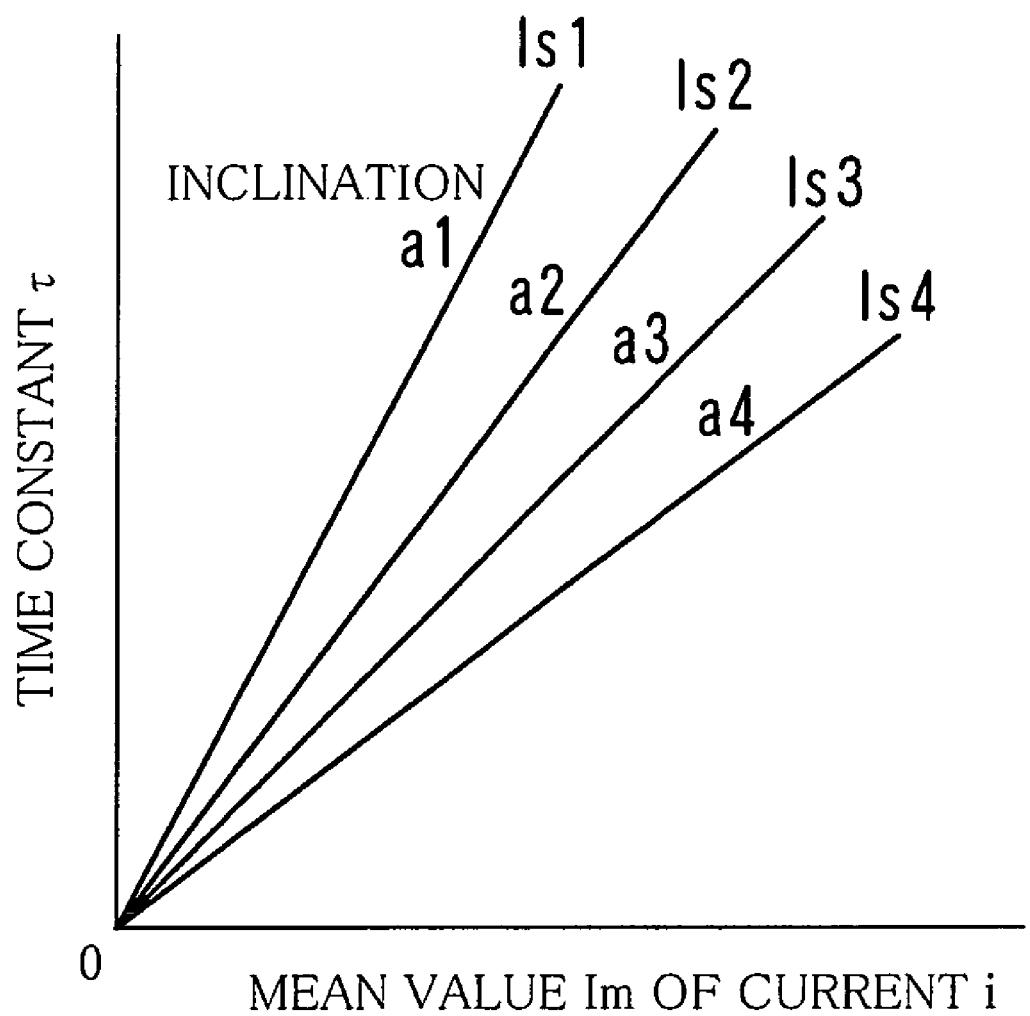
FIG. 9 is a diagram of an exemplified conversion table.

As shown in FIG. 9, there is a linear relationship between the mean value Im and the time constant τ, and the relationship can be expressed as a straight line on an XY coordinate. Accordingly, for example, with respect to the various peak values Is1, Is2, Is3, etc. of the current i, proportions between the mean value Im and the time constant τ, namely, inclinations a1, a2, a3, etc. of the straight lines, are previously obtained, and an inclination a corresponding to a detected peak value Is is multiplied by a detected mean value Im, so as to obtain a time constant τ.

Also in the case where the mean value Im is detected, if the control voltage is controlled so as to make the time constants τ of the positive and negative sides equal to each other, there is no need to obtain the time constants τ themselves. Therefore, without using the conversion table or the like, peak values Is and mean values Im of the positive and negative sides are detected, and the control voltage VC may be controlled so as to attain a given relationship between them.

It is noted that the peak value of the current i may be detected by using a peak hold circuit or the like. The time necessary for the current i to reduce to 36.8% of the peak value may be obtained by measuring, while comparing change of the current i with the peak value, time from the occurrence of the peak value to reduction to 36.8% with an appropriate timer. In order to detect the mean value Im, the current i is stored for one cycle by using, for example, an integration circuit, and the mean value is obtained on the basis of the magnitude of the thus stored voltage. Such a circuit may be realized by an analog circuit, a digital circuit using a CPU or the like, or a combination of them.

Next, some examples of the micro machine system 3 will be described.

Figure 10:
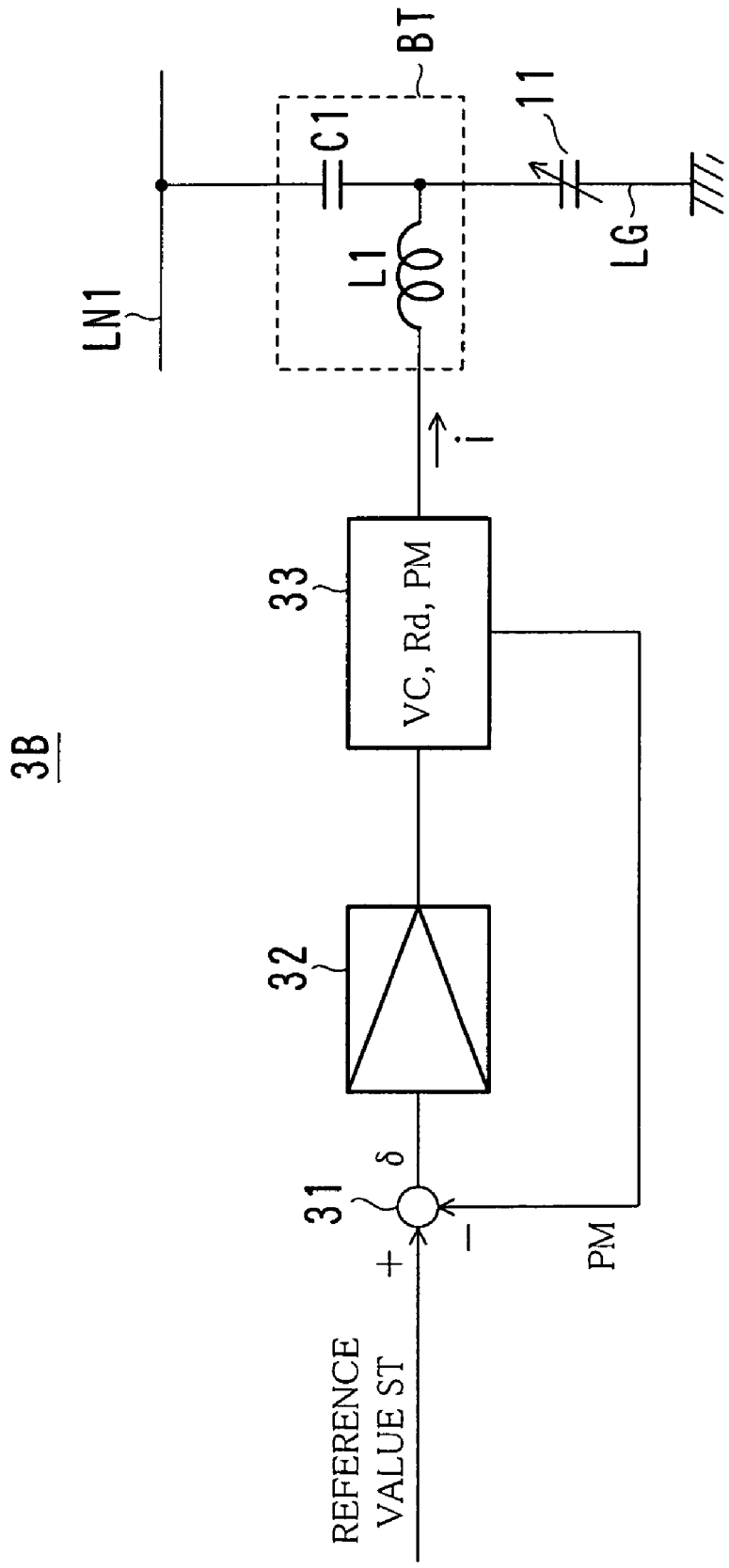
FIG. 10 is a circuit diagram of a micro machine system described as Example 1.

FIG. 10 is a circuit diagram of a micro machine system 3B described as Example 1.

In the configuration of FIG. 10, a variable capacitance device 11 is connected between a high-frequency line LN1 and a ground line LG with a capacitor C1 disposed between the variable capacitance device 11 and the high-frequency line LN1. The capacitor C1 constructs a bias tee BT together with an inductor L1, so as to prevent a control voltage VC applied for driving the variable capacitance device 11 from being applied to the high-frequency line LN1 and prevent a signal of a carrier frequency band on the high-frequency line LN1 from entering a current detector circuit 33.

The current detector circuit 33 detects a current i passing through the variable capacitance device 11 and acquires or generates parameters PM related to the current i with respect to both the positive side and the negative side thereof.

Examples of the parameters PM are the time Ts and the mean value Im mentioned above. The control voltage is feedback controlled so that the values of the parameters PM can accord with previously set reference values.

Specifically, a comparator 31 compares a set reference value ST with a parameter PM detected by the current detector circuit 33, and feeds a difference δ between the reference value and the parameter to an amplifier 32. The amplifier 32 amplifies the difference δ by a given scale factor previously set and feeds the resultant to the current detector circuit 33. The current detector circuit 33 generates a control voltage VC having given voltages Vc1 and Vc2 respectively on the positive and negative sides on the basis of the output from the amplifier 32, and outputs the control voltage VC. As the reference values ST, target values of the time constant τ, the time Ts, the mean value Im, the value of the capacitance CP and the like are set.

Figure 11:
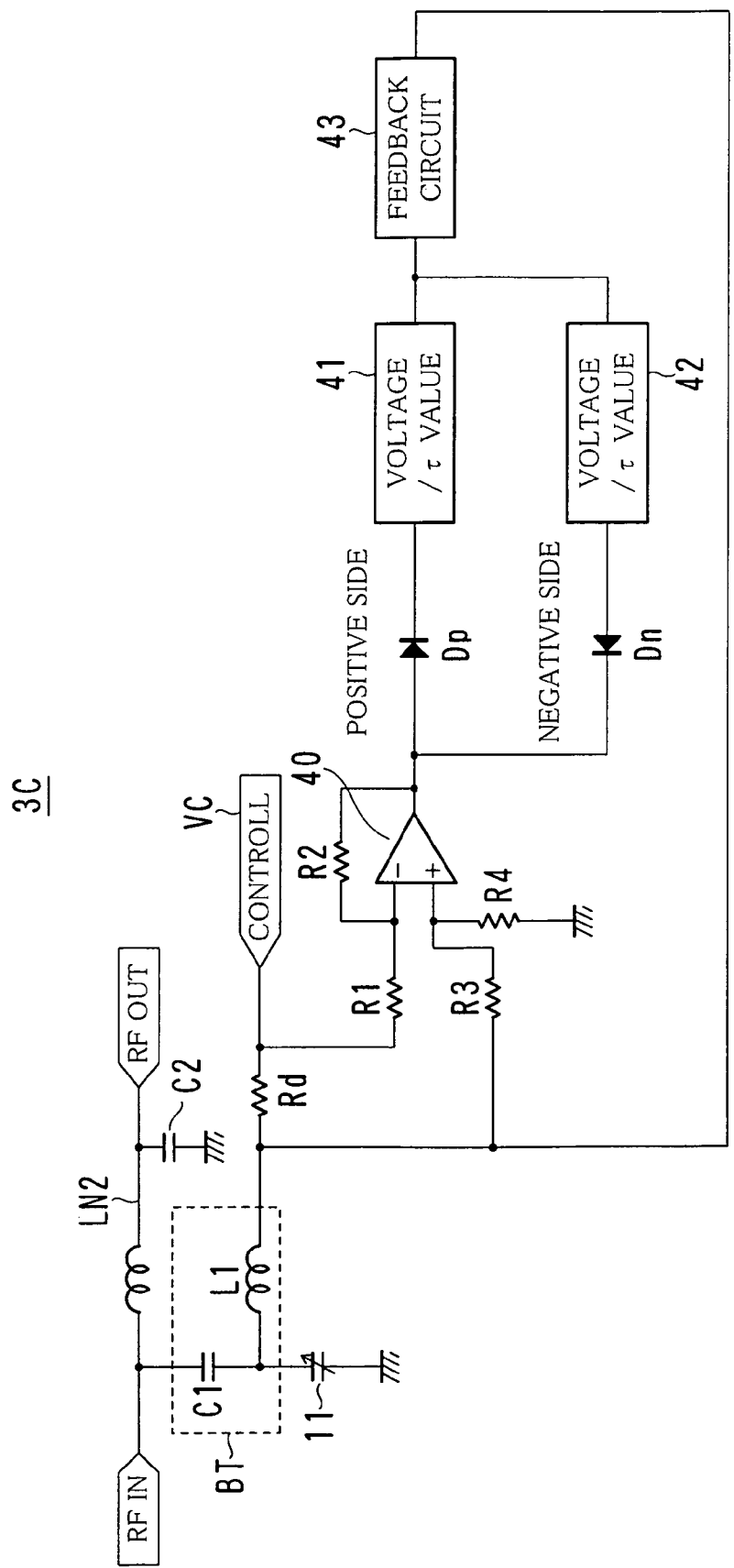
FIG. 11 is a circuit diagram of a micro machine system described as Example 2.
Figure 12:
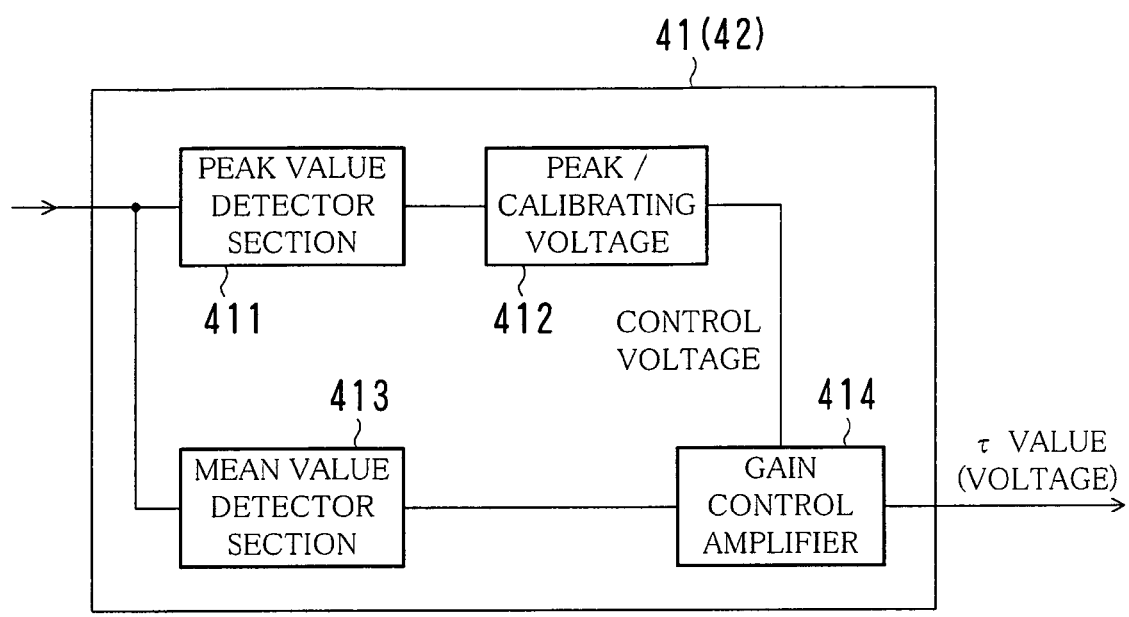
FIG. 12 is a diagram for showing the architecture of a voltage/τ value conversion circuit of the micro machine system.
Figure 13:
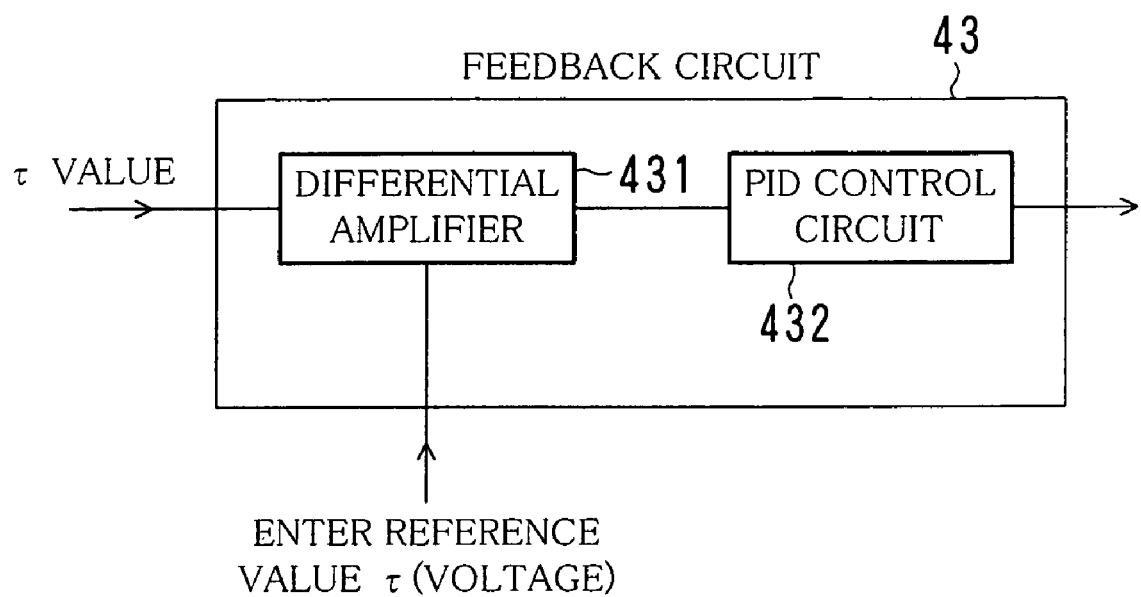
FIG. 13 is a diagram for showing the architecture of a feedback circuit.
Figure 14:
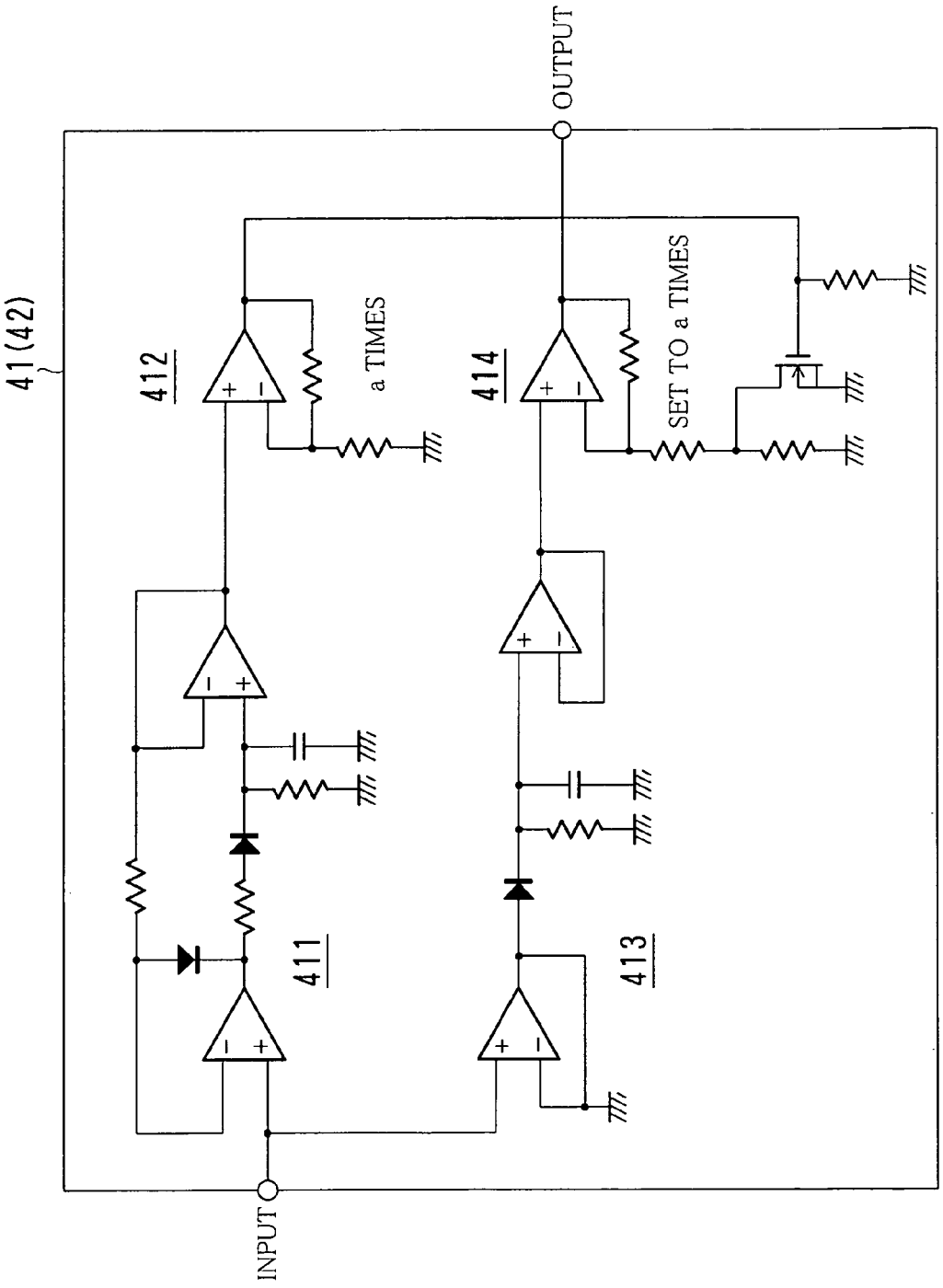
FIG. 14 is a circuit diagram of a specific example of the voltage/τ value conversion circuit.
Figure 15:
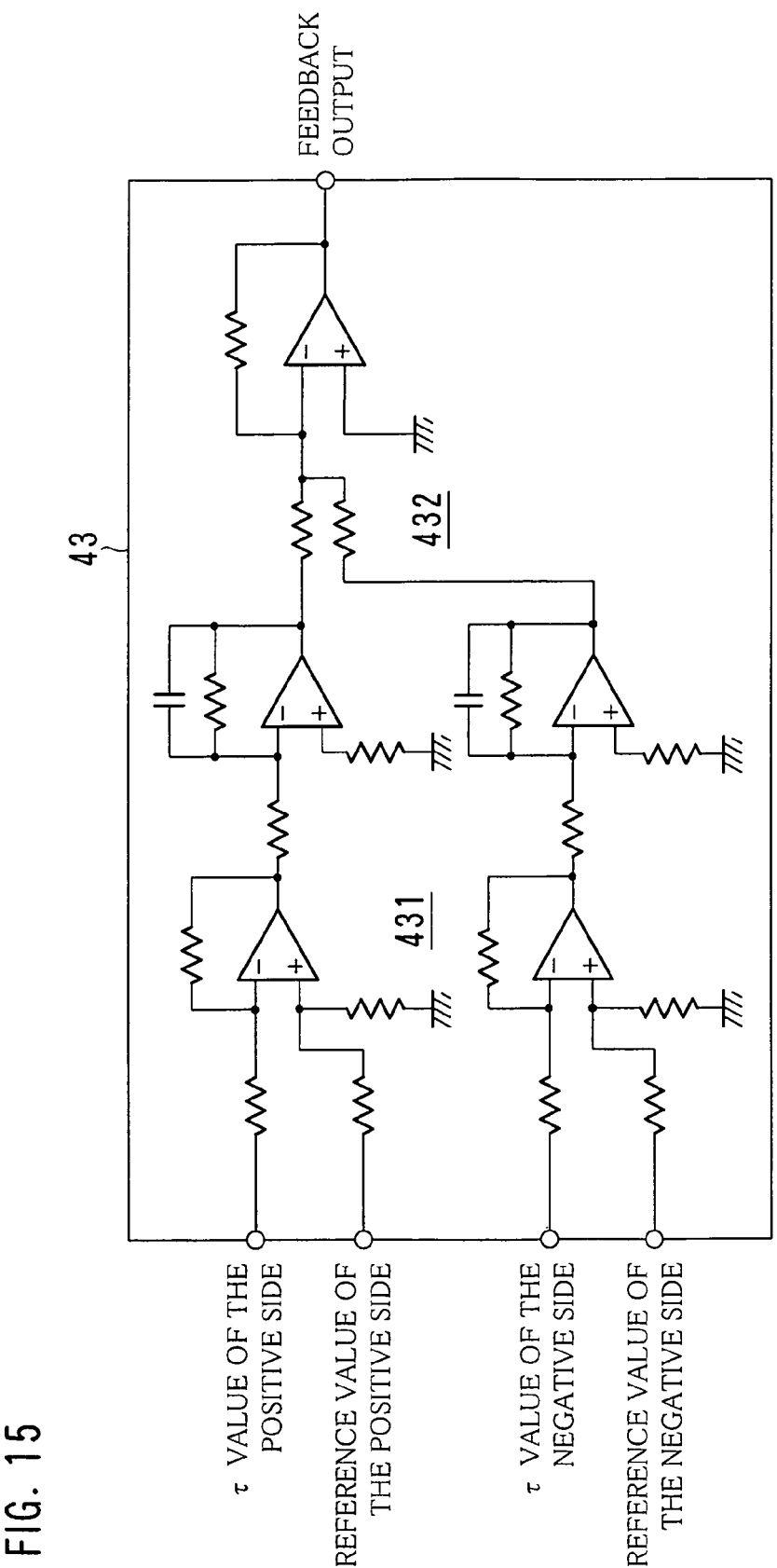
FIG. 15 is a circuit diagram of a specific example of the feedback circuit.

FIG. 11 is a circuit diagram of a micro machine system 3C described as Example 2, FIG. 12 is a diagram for showing the architecture of a voltage/τ value conversion circuit 41 or 42 of the micro machine system 3C, FIG. 13 is a diagram for showing the architecture of a feedback circuit 43 of the micro machine system 3C, FIG. 14 is an exemplified circuit diagram of the voltage/τ value conversion circuit 41 or 42, and FIG. 15 is an exemplified circuit diagram of the feedback circuit 43.

In the micro machine system of FIG. 11, a control voltage VC is applied to a variable capacitance device 11 by using a bias tee BT in the same manner as in Example 1. A current i caused in the variable capacitance device 11 by the control voltage VC is converted into a voltage Vi by a resistance Rd so as to be detected. The voltage Vi is differential amplified by a differential amplifier 40, and a positive side portion and a negative side portion of the amplified voltage are respectively input to the voltage/τ value conversion circuits 41 and 42 through diodes Dp and Dn. The voltage/τ value conversion circuits 41 and 42 are identical to each other and hence merely one of them is herein described.

In the voltage/τ value conversion circuit 41 shown in FIG. 12, on the basis of a signal input from the differential amplifier 40, a peak value Is is detected by a peak value detector section 411 and a mean value Im is detected by a mean value detector section 413. The peak value Is is converted into a mean value calibrating voltage Vh by a conversion circuit 412. The mean value Im is amplified by a gain control amplifier 414. At this point, the mean value calibrating voltage Vh is input to the gain control amplifier 414 as a control voltage, so that the mean value can be amplified with a gain in accordance with the control voltage. Thus, the gain control amplifier 414 outputs a τ value in accordance with the time constant.

In the feedback circuit 43 shown in FIG. 13, the τ value output from the voltage/τ value conversion circuit 41 of the positive side and the τ value output from the voltage/τ value conversion circuit 42 of the negative side are respectively compared with a reference value ST for a τ value of the positive side and a reference value ST for a τ value of the negative side by a differential amplifier 431, so as to output resultant differences. In general, the reference values ST for the positive side and the negative side are set to be equal to each other, but they may be set to be different from each other. The differences thus output are subjected to various operations for PID control by a PID control circuit 432. For example, a sum of the differences of the positive and negative sides is obtained. It is noted that the PID control circuit 432 is provided with an integrating circuit for setting integral time for feedback. The output of the feedback circuit 43 is supplied to the variable capacitance device 11 together with the control voltage VC.

In the voltage/τ value conversion circuit of FIG. 14, the peak value Is is held and detected by the peak value detector section 411. The mean value detector section 413 smoothes a supplied signal for detecting the mean value Im. The conversion circuit 412 generates a voltage corresponding to the "inclination a" of FIG. 9. In the gain control amplifier 414, the gain is set to "a times" on the basis of the output from the conversion circuit 412, and the mean value Im output from the mean value detector section 413 is amplified by the gain control amplifier 414. Thus, the gain control amplifier 414 outputs a τ value in accordance with the time constant.

In the feedback circuit of FIG. 15, a difference between the τ value and the reference value ST of the positive side and a difference between the τ value and the reference value ST of the negative side are obtained by the differential amplifier 431. The outputs corresponding to these differences of the differential amplifier 431 are integrated by integral circuits and the outputs of the integral circuits are added in the PID control circuit 432.

Figure 16:
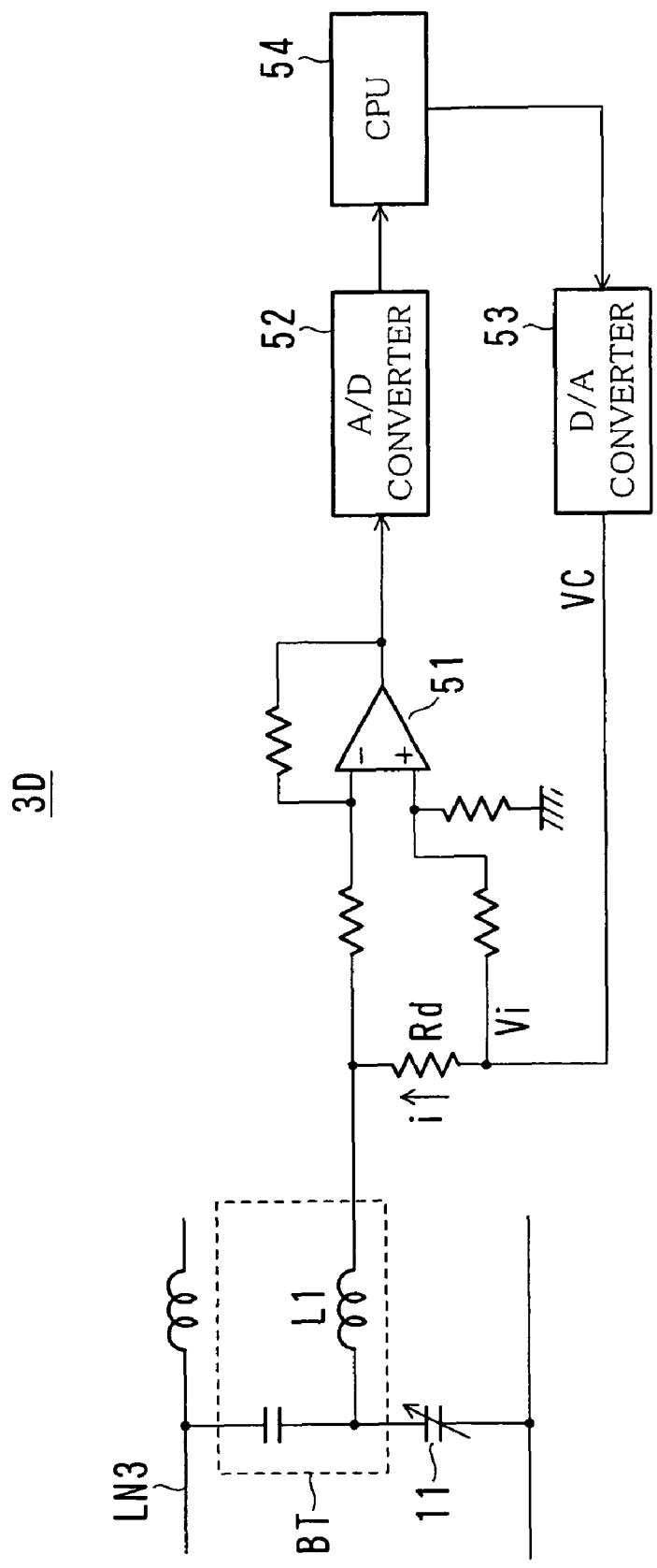
FIG. 16 is a circuit diagram of a micro machine system described as Example 3.
Figure 17:
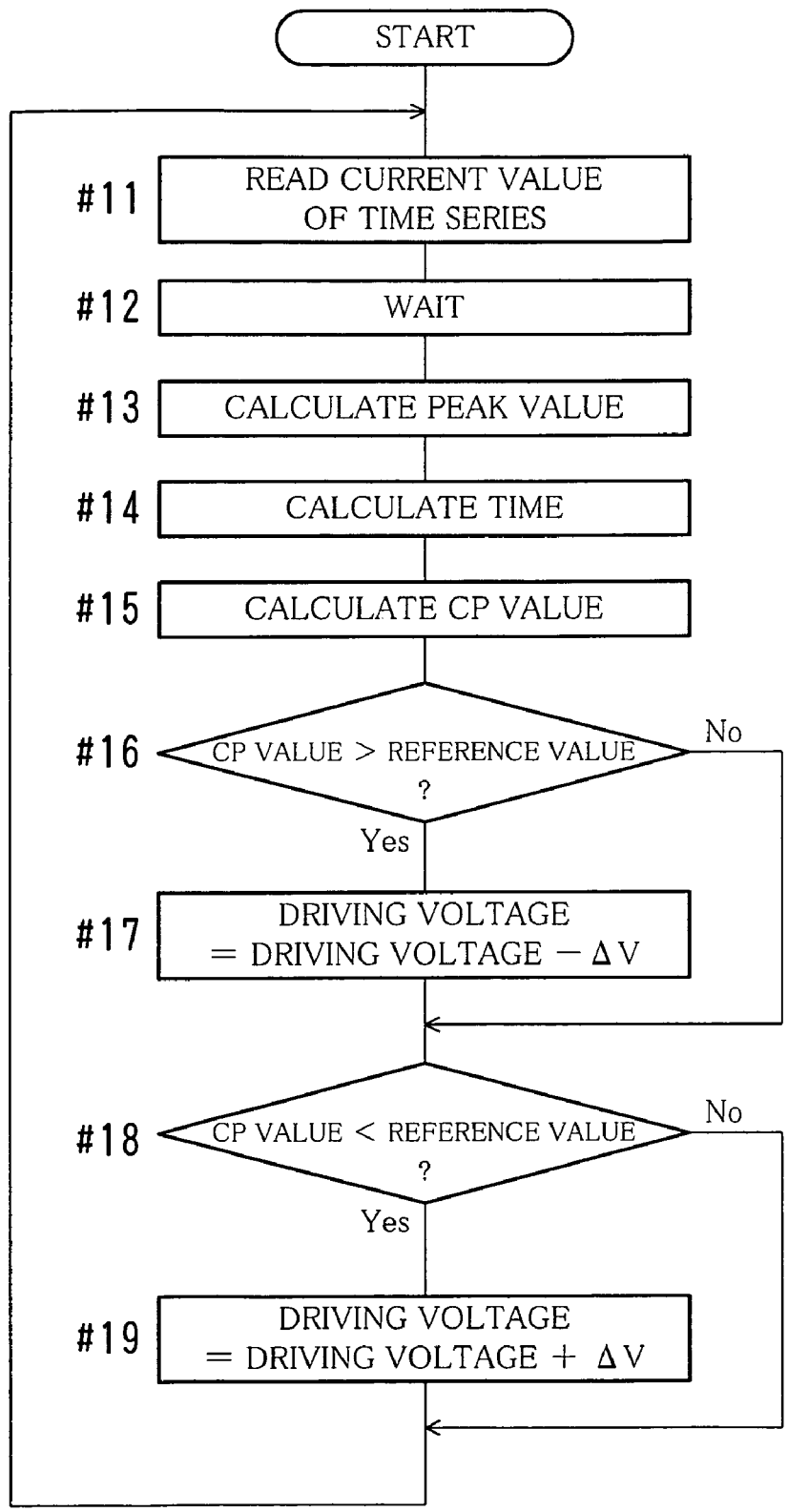
FIG. 17 is a flowchart of exemplified processing performed by the micro machine system.

FIG. 16 is a circuit diagram of a micro machine system 3D described as Example 3, and FIG. 17 is a flowchart of processing performed by the micro machine system 3D.

In the micro machine system of FIG. 16, a control voltage VC is applied to a variable capacitance device 11 by using a bias tee BT in the same manner as in Example 2. A current i caused in the variable capacitance device 11 by the control voltage VC is converted into a voltage Vi by a resistance Rd, thereby the current i being detected to be detected. The voltage Vi is differential amplified by a differential amplifier 51, and a positive side portion and a negative side portion of the amplified voltage are respectively digitalized into digital data by an A/D converter 52. The digital data includes waveform data of time series of a positive side portion and a negative side portion of the current i.

The digital data is input to a CPU 54 to be subjected to various operations. Through the operations performed in the CPU 54, a peak value Is, time Ts, a mean value Im and the like can be detected if necessary. The above-described conversion table may be contained in the CPU 54 or a peripheral circuit thereof, and thus, a time constant τ can be obtained based on the peak value of the current i and the mean value Im. Furthermore, although not shown in the drawing, reference values ST of the time constant τ, the time Ts, the mean value Im, the value of a capacitance CP and the like can be set in the CPU 54. In order to set the reference values ST, a keyboard, a touch panel and other various input means not shown are provided. The reference values ST thus set are stored in an appropriate memory area. The output from the CPU 54 is converted into a voltage by a D/A converter 53, so as to be applied to the variable capacitance device 11 as a control voltage VC.

In the flowchart of FIG. 17, while performing the switching drive, data of the current i is read as the current waveform of time series (#11). Then, the micro machine system waits (#12). In accordance with the length of this wait time, the integral time of the feedback control is determined.

Next, a peak value Is of the current i is calculated (#13). The time Ts necessary for the current i to reduce to 36.8% of the peak value Is is calculated (#14). On the basis of the time Ts and a value of the resistance Rd, the value of the capacitance CP is calculated in accordance with CP=Ts/Rd (#15).

In the case where the calculated value of the capacitance CP is larger than a target value of the capacitance set as a reference value ST (namely, Yes in #16), a small voltage ΔV is subtracted from a voltage Vc of the control voltage VC (#17). The small voltage ΔV may accord with, for example, the minimum unit of resolution determined by the number of bits of the A/D converter 52 and the D/A converter 53. On the other hand, in the case where the calculated value of the capacitance CP is smaller than the reference value ST (namely, Yes in #18), the small voltage ΔV, is added to the voltage Vc of the control voltage VC (#19).

Such processing is repeatedly executed on positive and negative side portions of the current i, and thus, the control voltage VC is automatically controlled so as to make the calculated value of the capacitance CP accord with the target value of the capacitance set as the reference value ST.

Next, another exemplified flowchart will be described.

Figure 18:
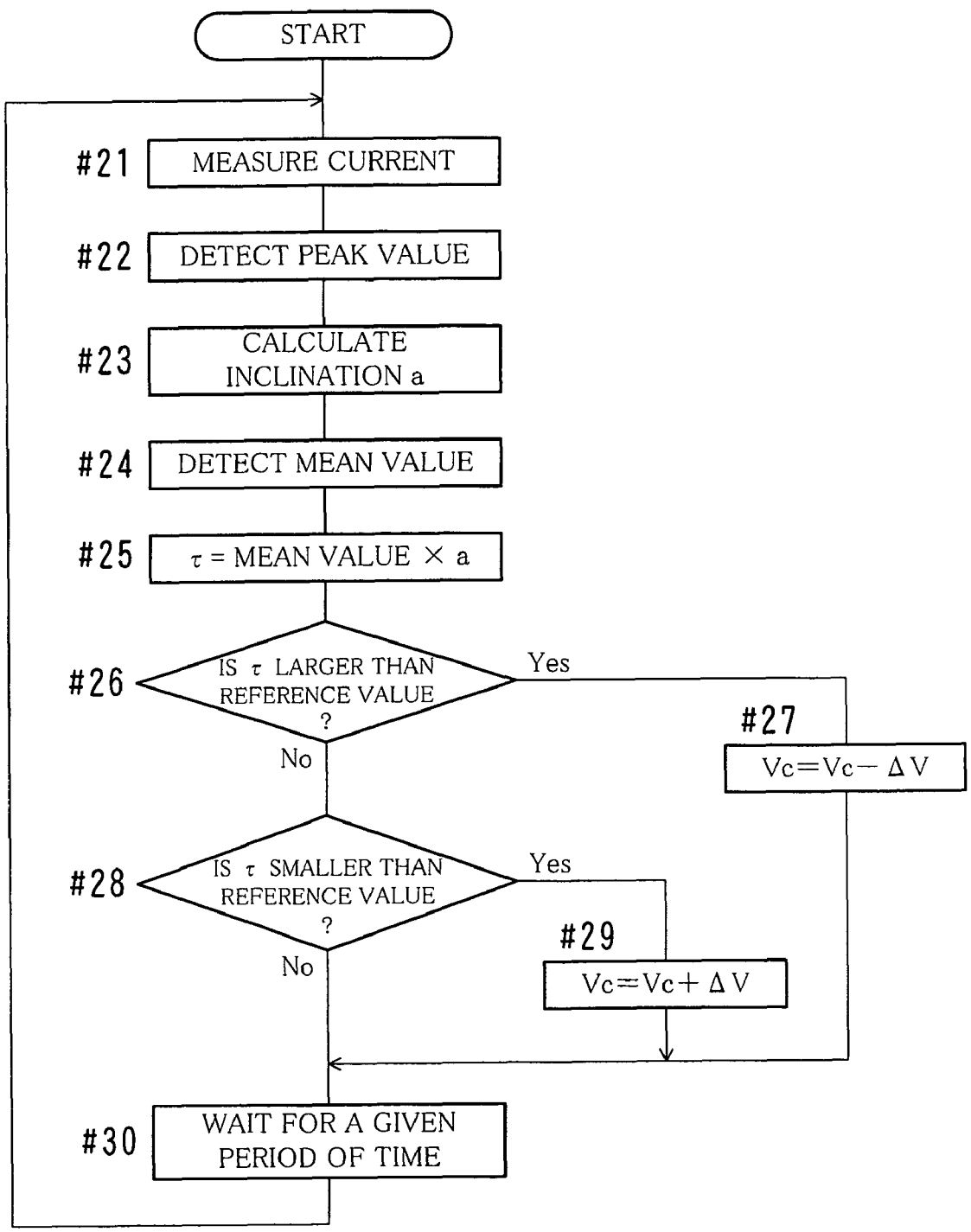
FIG. 18 is a flowchart of another exemplified processing.

FIG. 18 is a flowchart of another exemplified processing performed by the micro machine system 3D.

In the flowchart of FIG. 18, while performing the switching drive, data of a current i is read (#21). A peak value Is of the current i is calculated (#22). An inclination a is calculated (#23). A mean value Im of the current i is calculated (#24). A time constant τ is obtained based on a conversion table (#25). In the case where the obtained time constant τ is larger than a time constant set as a reference value ST (namely, Yes in #26), a small voltage ΔV is subtracted from a voltage Vc of the control voltage VC (#27). In the case where the obtained time constant τ is smaller than the reference voltage ST (namely, Yes in #28), the small voltage ΔV is added to the voltage Vc of the control voltage VC (#29). Thereafter, the micro machine system waits for a given period of time (#30). This wait time corresponds to control response time.

In the same manner as in the flowchart of FIG. 17, such processing is repeatedly executed on positive and negative side portions of the current i, and thus, the control voltage VC is automatically controlled so as to make the calculated value of the time constant τ accord with the target value of the time constant set as the reference value ST.

Figure 19:
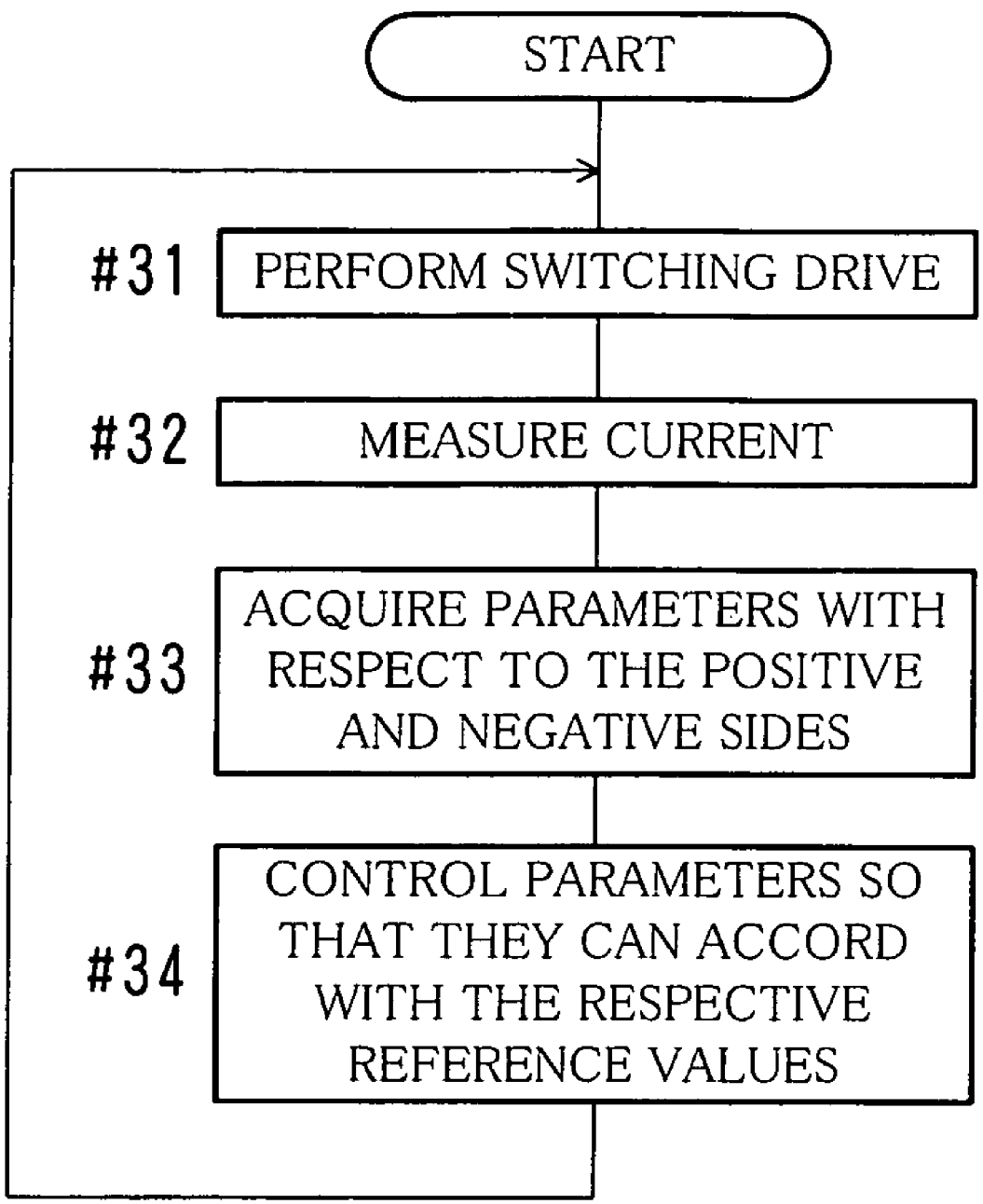
FIG. 19 is a flowchart of still another exemplified processing.

FIG. 19 is a flowchart of still another exemplified processing performed by the micro machine system 3D.

In the flowchart of FIG. 19, while performing the switching drive under application of the control voltage VC (#31), a current i passing through the variable capacitance device 11 are detected with respect to positive and negative sides (#32). On the basis of the detected current i, parameters PM related to the capacitance CP of the variable capacitance device 11 are acquired with respect to the positive and negative sides (#33). As such parameters PM, the aforementioned time Ts, the mean value Im and the like can be used.

The control voltage VC is controlled so that the parameters PM acquired with respect to the positive and negative sides can accord with each other.

Figure 20:
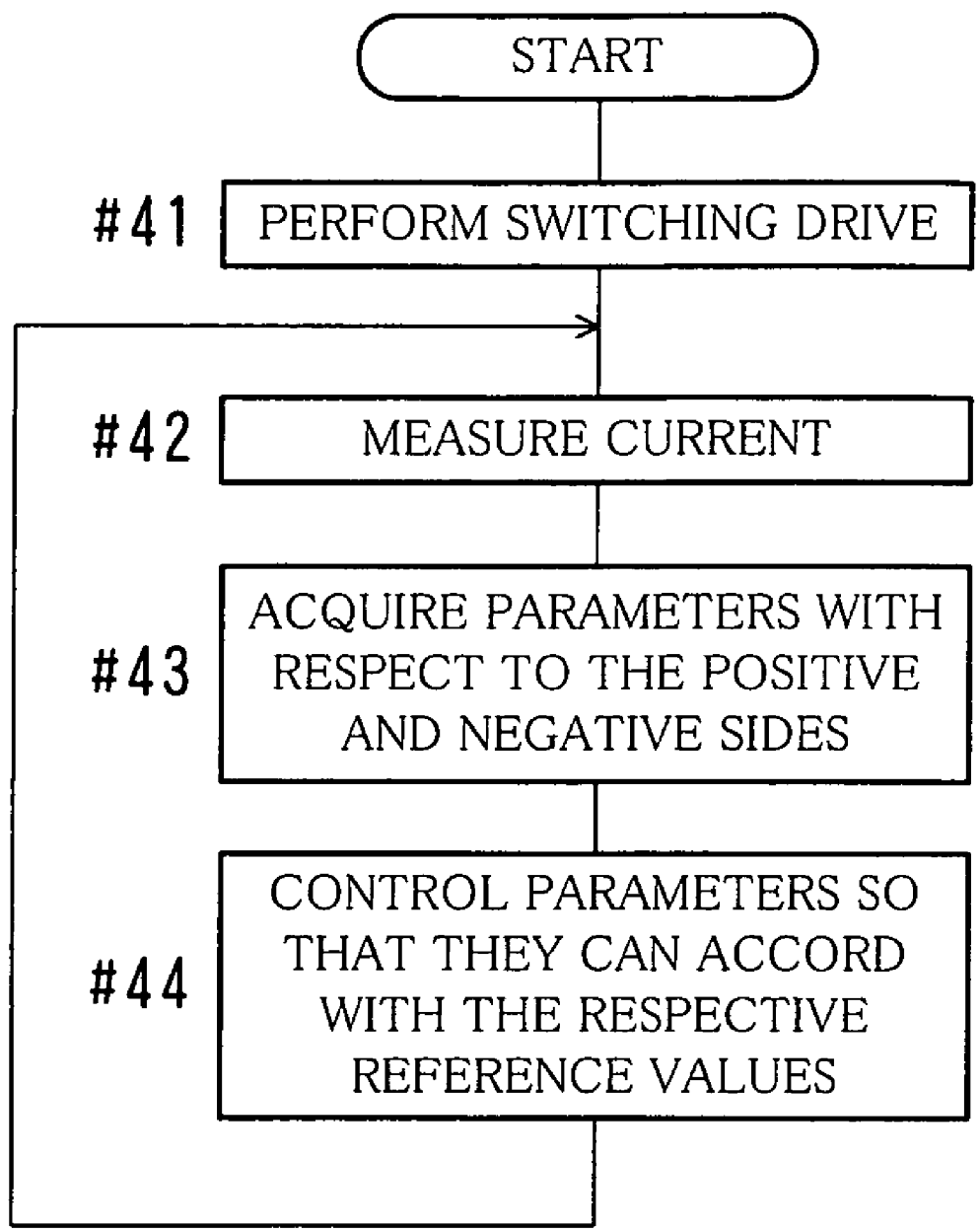
FIG. 20 is a flowchart of still another exemplified processing.

FIG. 20 is a flowchart of still another exemplified processing performed by the micro machine system 3D.

In the flowchart of FIG. 20, procedures of steps #41 through #43 are the same as those of steps #31 through #33 described above. In step #44, the control voltage VC is controlled so that the parameters PM acquired with respect to the negative and positive sides can respectively accord with reference values ST set with respect to the negative and positive sides.

According to this embodiment, since the switching drive is employed, a positive voltage and a negative voltage are alternately applied to the two electrodes 24 and 25 of the variable capacitance device 11, so as not to cause polarization derived from movement of space charge within the dielectric film 26, and thus, the occurrence of charge-up can be suppressed. In addition, the variation of the capacitance CP of the variable capacity device 11 between the positive side and the negative side can be suppressed. As a result, the value of the capacitance CP of the variable capacitance device 11 can be accurately controlled in accordance with the control voltage VC.

In this manner, the reproducibility of the capacitance CP of the variable capacitance device 11 is improved so as to retain characteristics necessary for a circuit, and therefore, the variable capacitance device 11 is applicable to various circuits.

In the above-described embodiment, the architecture, the shape, the material and the number of variable capacitance device 11 can be variously modified. Moreover, the architecture, the configuration, the shape, the number and the circuit constant of the whole or each part of or each circuit included in each of the micro machine systems 3, 3B, 3C and 3D, the waveform of the control voltage VC, the timing of switching polarities, cycles or frequencies, contents or orders of processes of the flowchart can be appropriately modified within the scope of the invention.

Although a variable capacitance device is herein exemplarily described as a micro machine system, the invention is applicable to another micro machine device in which charge-up may be caused by a control voltage VC. For example, when a micro machine device not used as a variable capacitance device is drive controlled in the same manner as described in this embodiment, various effects owing to a constantly kept capacitance can be expected.

While a preferred embodiment has been described, variations thereto will occur to those skilled in the art within the scope of the present inventive concepts which are delineated by the following claims.

What is claimed is:

1. A method for drive controlling a micro machine device including two electrodes opposing each other and a dielectric layer sandwiched therebetween, the method comprising:
    applying a control voltage in a rectangular waveform in which positive and negative polarities are alternately inverted between the two electrodes;
    detecting a current passing through the micro machine device due to the application of the control voltage with respect to positive and negative sides;
    acquiring parameters related to a capacitance of the micro machine device with respect to the positive and negative sides on the basis of the detected current; and
    controlling the control voltage in such a manner that the parameters acquired with respect to the positive and negative sides become equal to each other.

2. A method for drive controlling a micro machine device including two electrodes opposing each other and a dielectric layer sandwiched therebetween, the method comprising:
    applying a control voltage in a rectangular waveform in which positive and negative polarities are alternately inverted between the two electrodes;
    detecting a current passing through the micro machine device due to application of the control voltage with respect to positive and negative sides;
    acquiring parameters related to a capacitance of the micro machine device with respect to the positive and negative sides on the basis of the detected current; and
    controlling the control voltage in such a manner that the parameters acquired with respect to the positive and negative sides accord with a reference value set with respect to the parameters.

3. A method for drive controlling a micro machine device including two electrodes opposing each other and a dielectric layer sandwiched therebetween, the method comprising:
    applying a control voltage in a rectangular waveform in which positive and negative polarities are alternately inverted between the two electrodes; and controlling magnitude of the control voltage in such a manner that time elapsed until a peak value of a current at a rise of the rectangular waveform is reduced to a given ratio is equal in a positive portion of the rectangular waveform and a negative portion of the rectangular waveform.

4. A method for drive controlling a micro machine device including two electrodes opposing each other and a dielectric layer sandwiched therebetween, the method comprising:
applying a control voltage in a rectangular waveform in which positive and negative polarities are alternately inverted between the two electrodes; and
controlling magnitude of the control voltage in such a manner that time elapsed until a peak value of a current at a rise of the rectangular waveform is reduced to a given ratio accords with a given set value.

5. The method for drive controlling a micro machine device according to claim 4,
wherein the given ratio is 36.8%, and
the given set value is equal to a time constant $\tau$ obtained in charging a capacitance formed between the two electrodes with the control voltage.

6. A method for drive controlling a micro machine device including two electrodes opposing each other and a dielectric layer sandwiched therebetween, the method comprising:
applying, between the two electrodes, a control voltage in a rectangular waveform in which positive and negative polarities are alternately inverted;
detecting a peak value of a current obtained at a rise of the rectangular waveform;
detecting a mean value of the current in the rectangular waveform;
obtaining a time constant $\tau$ on the basis of the detected peak value and the detected mean value;
reducing an absolute value of the control voltage of a polarity of the moment when the obtained time constant $\tau$ is larger than a set value; and
increasing the absolute value of the control voltage of the polarity of the moment when the obtained time constant $\tau$ is smaller than the set value.

7. The method for drive controlling a micro machine device according to claim 6,
wherein the time constant $\tau$ is obtained by storing time constant data resulting from previously obtained relationships among a peak value of the current, a mean value of the current and a time constant $\tau$ in charging a capacitance with the rectangular waveform and by using the stored time constant data.

8. An apparatus for drive controlling a micro machine device including two electrodes opposing each other and a dielectric layer sandwiched therebetween, the apparatus comprising:
a control voltage applying portion for applying, between the two electrodes, a control voltage in a rectangular waveform in which positive and negative polarities are alternately inverted;
a current detecting portion for detecting a current passing through the micro machine device due to application of the control voltage with respect to positive and negative sides;
an acquiring portion for acquiring parameters related to a capacitance of the micro machine device with respect to the positive and negative sides on the basis of the detected current; and
a controlling portion for controlling the control voltage in such a manner that the parameters acquired with respect to the positive and negative sides become equal to each other.

9. An apparatus for drive controlling a micro machine device including two electrodes opposing each other and a dielectric layer sandwiched therebetween, the apparatus comprising:
a control voltage applying portion for applying, between the two electrodes, a control voltage in a rectangular waveform in which positive and negative polarities are alternately inverted;
a measuring portion for measuring time elapsed until a peak value of a current at a rise of the rectangular waveform is reduced to a given ratio; and
a controlling portion for controlling magnitude of the control voltage in such a manner that the measured time is equal in a positive portion of the rectangular waveform and a negative portion of the rectangular waveform.

10. An apparatus for drive controlling a micro machine device including two electrodes opposing each other and a dielectric layer sandwiched therebetween, the apparatus comprising:
a control voltage applying portion for applying, between the two electrodes, a control voltage in a rectangular waveform in which positive and negative polarities are alternately inverted;
a measuring portion for measuring time elapsed until a peak value of a current at a rise of the rectangular waveform is reduced to a given ratio; and
a controlling portion for controlling magnitude of the control voltage in such a manner that the measured time accords with a given set value.

\* \* \* \* \*